US012727510B2

(12) United States Patent
Yu et al.

(10) Patent No.: US 12,727,510 B2
(45) Date of Patent: Sep. 1, 2026

(54) LIGHT-EMITTING MODULE AND METHOD OF MANUFACTURING THE SAME, DISPLAY APPARATUS

(71) Applicants: Fuzhou BOE Optoelectronics Technology Co., Ltd., Fujian (CN); BOE TECHNOLOGY GROUP CO., LTD., Beijing (CN)

(72) Inventors: Hui Yu, Beijing (CN); Han Zhang, Beijing (CN); Qifei Chen, Beijing (CN); Dingjie Zheng, Beijing (CN); Ming Chen, Beijing (CN); Laiyou Cui, Beijing (CN); Chengkun Liu, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 762 days.

(21) Appl. No.: 18/044,320

(22) PCT Filed: Jun. 30, 2022

(86) PCT No.: PCT/CN2022/103194
§ 371 (c)(1),
(2) Date: Mar. 7, 2023

(87) PCT Pub. No.: WO2024/000548
PCT Pub. Date: Jan. 4, 2024

(65) Prior Publication Data

US 2024/0213226 A1 Jun. 27, 2024

(51) Int. Cl.
*H10W 90/00* (2026.01)
*H10H 20/01* (2025.01)
*H10H 20/857* (2025.01)

(52) U.S. Cl.
CPC .......... *H10W 90/00* (2026.01); *H10H 20/857* (2025.01); *H10H 20/0364* (2025.01)

(58) Field of Classification Search
CPC .... H01L 25/0753; H01L 33/00; H10H 20/857
(Continued)

(56) References Cited

U.S. PATENT DOCUMENTS

2006/0201039 A1* 9/2006 Gilliland .................. A47G 1/16 40/605
2012/0195069 A1 8/2012 Yeh et al.
(Continued)

FOREIGN PATENT DOCUMENTS

CN 101149534 A 3/2008
CN 202056686 U 11/2011
(Continued)

OTHER PUBLICATIONS

The First Office Action mailed May 12, 2026, in Chinese Application No. 202280001999.4, 15 pages including English translation.

*Primary Examiner* — Edwyn Labaze
(74) *Attorney, Agent, or Firm* — XSENSUS LLP

(57) ABSTRACT

A light-emitting module includes a carrier substrate, a first light-emitting circuit layer, a backboard, a mounting cavity and at least one connection member. The first light-emitting circuit layer is disposed on the carrier substrate. The backboard is disposed on a side of the carrier substrate away from the first light-emitting circuit layer and is in contact with the carrier substrate. The mounting cavity is disposed in at least one of the backboard and the carrier substrate, and an inner wall of the mounting cavity is enclosed by both the backboard and the carrier substrate. A connection member is disposed in the mounting cavity and fixedly connected to the carrier substrate and the backboard.

20 Claims, 12 Drawing Sheets

(58) Field of Classification Search
USPC .......................................... 362/612, 611, 600
See application file for complete search history.

(56) References Cited

U.S. PATENT DOCUMENTS

| | | | | |
|---|---|---|---|---|
| 2016/0170134 | A1* | 6/2016 | Li | G02B 6/0091 349/65 |
| 2021/0125561 | A1* | 4/2021 | Choi | G09G 3/3233 |
| 2022/0190043 | A1 | 6/2022 | Ge | |
| 2022/0299823 | A1 | 9/2022 | Li et al. | |
| 2023/0296224 | A1* | 9/2023 | Tsai | H10K 59/879 362/84 |

FOREIGN PATENT DOCUMENTS

| | | | | | |
|---|---|---|---|---|---|
| CN | 102620254 | A | | 8/2012 | |
| CN | 202581233 | U | | 12/2012 | |
| CN | 106154646 | A | | 11/2016 | |
| CN | 208779419 | U | | 4/2019 | |
| CN | 210181973 | U | | 3/2020 | |
| CN | 210401957 | U | | 4/2020 | |
| CN | 111128048 | A | * | 5/2020 | H10H 29/10 |
| CN | 111509011 | A | | 8/2020 | |
| CN | 111684576 | A | * | 9/2020 | H01L 23/544 |
| CN | 113658974 | A | | 11/2021 | |
| CN | 113721386 | A | | 11/2021 | |
| CN | 114545685 | A | | 5/2022 | |
| JP | 2017174601 | A | | 9/2017 | |
| WO | 2021218478 | A1 | | 11/2021 | |

* cited by examiner

A1-A2

1000

DP

CC

LD

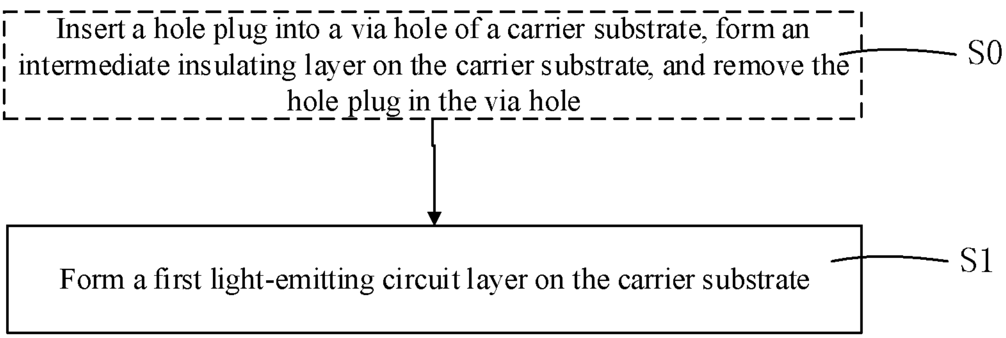

Provide a backboard on a side of the carrier substrate away from the first light-emitting circuit layer, and the backboard is in contact with the carrier substrate; provide a mounting cavity in at least one of the backboard and the carrier substrate, and an inner wall of the mounting cavity is enclosed by both the backboard and the carrier substrate

S2

Provide a connection member in the mounting cavity, so that the connection member is fixedly connected to the carrier substrate and the backboard

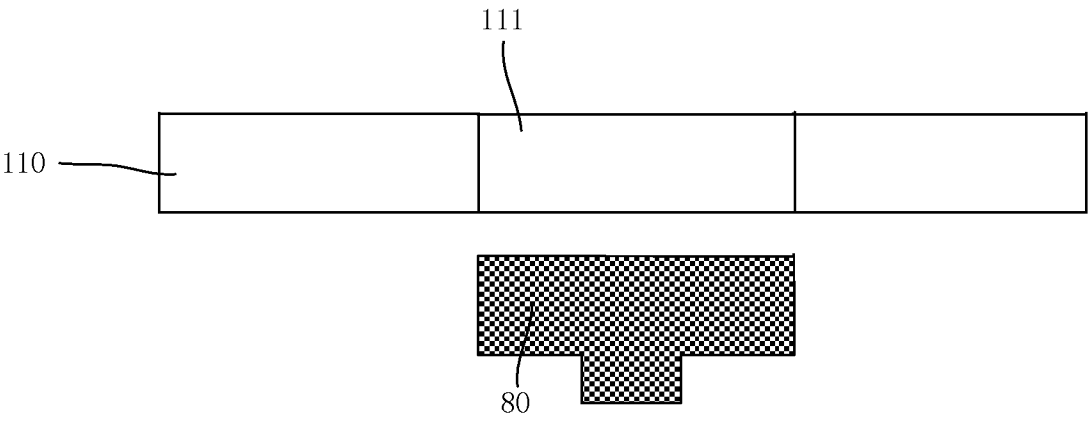

FIG. 14a

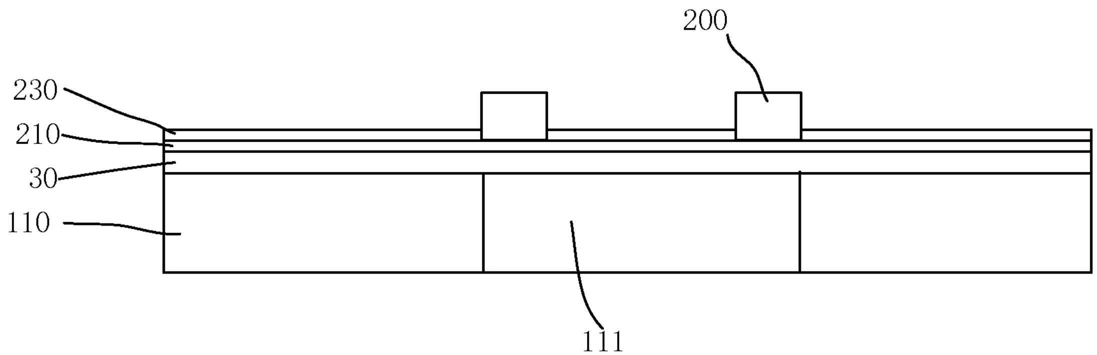
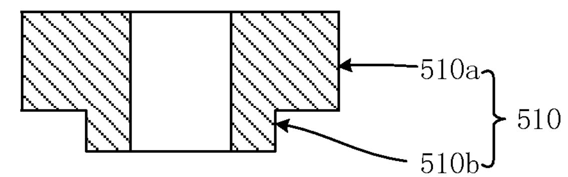
FIG. 14f
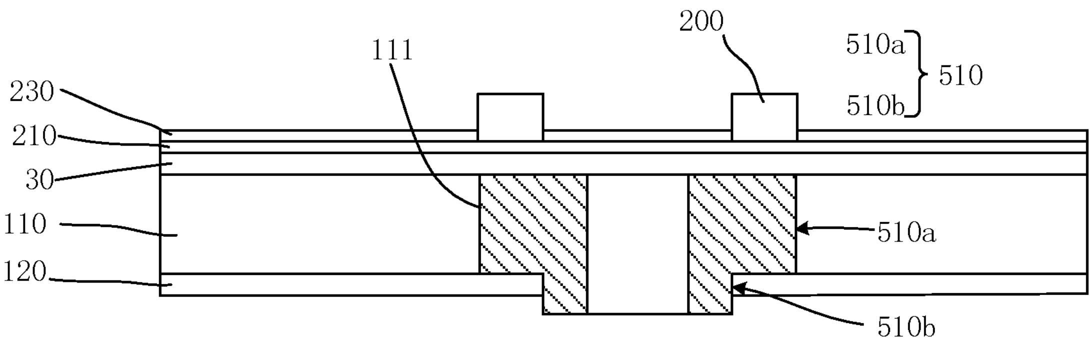
FIG. 14g

LIGHT-EMITTING MODULE AND METHOD OF MANUFACTURING THE SAME, DISPLAY APPARATUS

CROSS-REFERENCE TO RELATED APPLICATION

This application is a national phase entry under 35 USC 371 of International Patent Application No. PCT/CN2022/103194, filed on Jun. 30, 2022, which is incorporated herein by reference in its entirety.

TECHNICAL FIELD

The present disclosure relates to the field of display technologies, and in particular, to a light-emitting module and a method of manufacturing the same, and a display apparatus.

BACKGROUND

A lamp panel including, for example, a mini light emitting diode (Mini LED) may be applied to a backlight module of a liquid crystal display, so that a thickness of the backlight module may be reduced. As a result, an overall thickness of the liquid crystal display is reduced, and a requirement for a light weight and a small thickness of the display is satisfied.

SUMMARY

In an aspect, a light-emitting module is provided. The light-emitting module includes a carrier substrate, a first light-emitting circuit layer, a backboard, a mounting cavity and at least one connection member. The first light-emitting circuit layer is disposed on the carrier substrate. The backboard is disposed on a side of the carrier substrate away from the first light-emitting circuit layer and is in contact with the carrier substrate. The mounting cavity is disposed in at least one of the backboard and the carrier substrate, and an inner wall of the mounting cavity is enclosed by both the backboard and the carrier substrate. A connection member is disposed in the mounting cavity and fixedly connected to the carrier substrate and the backboard.

In some embodiments, the mounting cavity includes a mounting groove disposed in the carrier substrate and a via hole penetrating the backboard. An opening of the mounting groove is disposed in a surface of the carrier substrate proximate to the backboard; at least a portion of the connection member is fixed in the mounting groove. The connection member extends to a side of the backboard away from the carrier substrate through the via hole and is in contact with a surface of the backboard away from the carrier substrate.

In some embodiments, the mounting groove penetrates the carrier substrate.

In some embodiments, the light-emitting module further includes an intermediate insulating layer. The intermediate insulating layer is disposed between the first light-emitting circuit layer and the carrier substrate.

In some embodiments, the connection member includes a first connection portion and a second connection portion that are matched with each other; at least a portion of the first connection portion is fixed in the mounting groove; the second connection portion is fixedly connected to the backboard and the first connection portion.

In some embodiments, the first connection portion is a nut, and the second connection portion is a screw.

In some embodiments, the first connection portion includes a fixing portion and a positioning portion that are connected to each other; the fixing portion is fixedly disposed in the mounting groove, and the positioning portion is located in the via hole.

In some embodiments, a height of the fixing portion in an axial direction thereof is substantially equal to a depth of the mounting groove.

In some embodiments, a height of the fixing portion in an axial direction thereof is less than a depth of the mounting groove.

In some embodiments, the positioning portion is in clearance fit with the via hole.

In some embodiments, the first connection portion is riveted to the mounting groove.

In some embodiments, the fixing portion is riveted to the mounting groove.

In some embodiments, a number of the at least one connection member is at least two, and a distance between two adjacent connection members is in a range from 120 mm to 130 mm.

In some embodiments, the intermediate insulating layer is made of a thermosetting resin.

In some embodiments, the light-emitting module further includes a second light-emitting circuit layer. The second light-emitting circuit layer is disposed on a side of the backboard away from the carrier substrate.

In another aspect, a method of manufacturing a light-emitting module is provided. The method includes:

- forming a first light-emitting circuit layer on a carrier substrate;
- providing a backboard on a side of the carrier substrate away from the first light-emitting circuit layer; the backboard being in contact with the carrier substrate;
- providing a mounting cavity in at least one of the backboard and the carrier substrate; an inner wall of the mounting cavity being enclosed by both the backboard and the carrier substrate; and
- providing a connection member in the mounting cavity, so that the connection member is fixedly connected to the carrier substrate and the backboard.

In some embodiments, the mounting cavity includes a mounting groove disposed in the carrier substrate and a via hole penetrating the backboard. An opening of the mounting groove is disposed in a surface of the carrier substrate proximate to the backboard. The connection member includes a first connection portion and a second connection portion.

Providing the connection member in the mounting cavity includes: fixing at least a portion of the first connection portion in the mounting groove; and making the second connection portion pass through the via hole and be matched with the first connection portion.

In some embodiments, the mounting groove penetrates the carrier substrate.

Before the first light-emitting circuit layer is formed on the carrier substrate, the method of manufacturing the light-emitting module further includes: inserting a hole plug into the mounting groove of the carrier substrate; forming an intermediate insulating layer on the carrier substrate; and removing the hole plug in the mounting groove.

Forming the first light-emitting circuit layer on the carrier substrate includes forming the first light-emitting circuit layer on a side of the intermediate insulating layer away from the carrier substrate.

In some embodiments, after the hole plug is inserted into the mounting groove, an anti-adhesion film is formed between the hole plug and the mounting groove.

In yet another aspect, a display apparatus is provided. The display apparatus includes the light-emitting module.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

FIG. 13 is a flow diagram of a method of manufacturing a light-emitting module, in accordance with some embodiments;

FIG. 14*a* is a structural diagram of a base substrate and a hole plug, in accordance with some embodiments;

FIG. 14*f* is a diagram showing a structure of a portion of a light-emitting module, in accordance with some embodiments;

FIG. 14*g* is a diagram showing a structure of another portion of a light-emitting module, in accordance with some embodiments;

DETAILED DESCRIPTION

Figure 1:
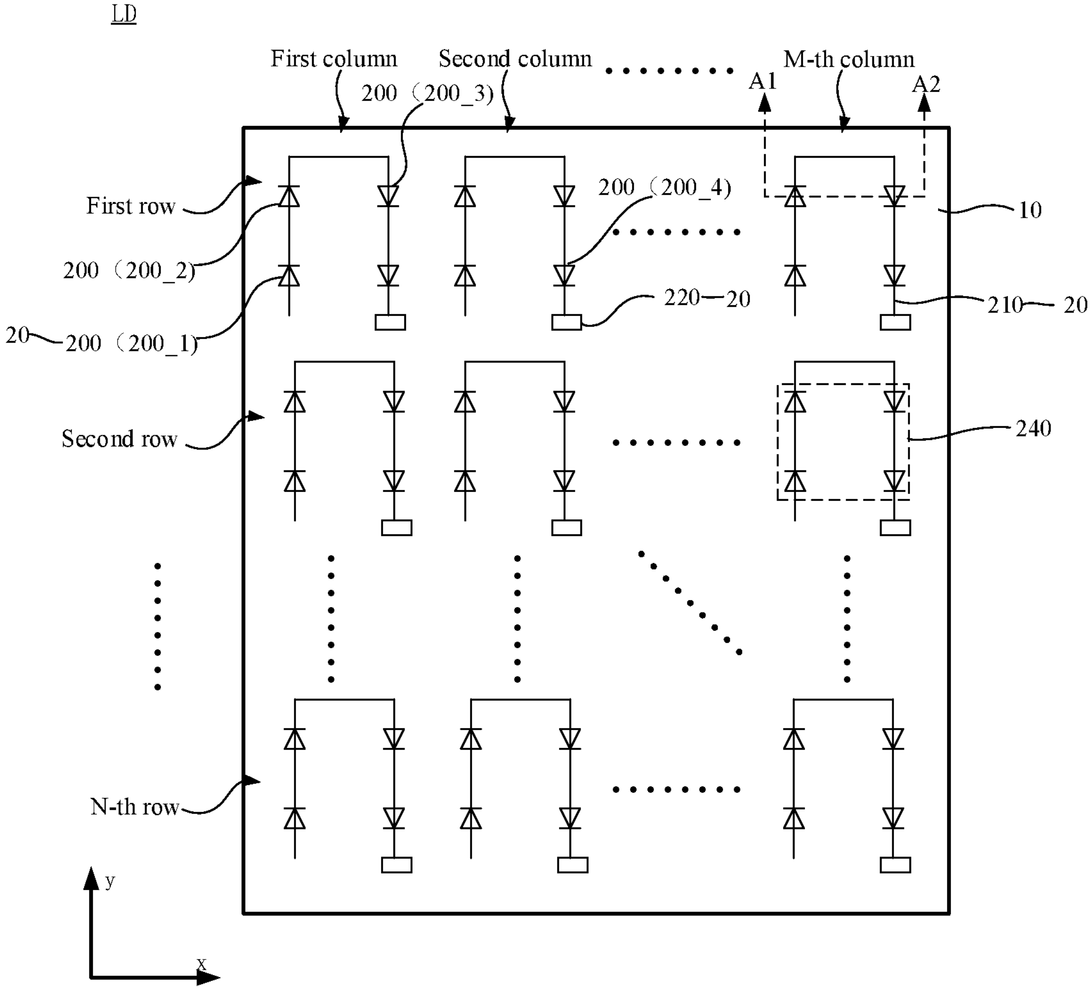
FIG. 1 is a top view of a light-emitting module, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase “A and/or B” includes the following three combinations: only A, only B, and a combination of A and B.

As used herein, the term “if” is optionally construed as “when” or “in a case where” or “in response to determining that” or “in response to detecting”, depending on the context. Similarly, depending on the context, the phrase “if it is determined that” or “if [a stated condition or event] is detected” is optionally construed as “in a case where it is determined that”, “in response to determining that”, “in a case where [the stated condition or event] is detected”, or “in response to detecting [the stated condition or event]”.

The phrase “applicable to” or “configured to” as used herein indicates an open and inclusive expression, which does not exclude devices that are applicable to or configured to perform additional tasks or steps.

Additionally, the phase “based on” as used herein is meant to be open and inclusive, since a process, a step, a calculation or other action that is “based on” one or more of stated conditions or values may, in practice, be based on additional conditions or values beyond those stated.

As used herein, the term such as “about”, “substantially” or “approximately” includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term such as “parallel”, “perpendicular” or “equal” includes a stated condition and a condition similar to the stated condition, a range of the similar condition is within an acceptable range of deviation, and the acceptable range of deviation is determined by a person of ordinary skill in the art, considering measurement in question and errors associated with measurement of a particular quantity (i.e., limitations of a measurement system). For example, the term “parallel” includes absolute parallelism and approximate parallelism, and an acceptable range of deviation of the approximate parallelism may be, for example, a deviation within 5°; the term “perpendicular” includes absolute perpendicularity and approximate perpendicularity, and an acceptable range of deviation of the approximate perpendicularity may also be, for example, a deviation within 5°; the term “equal” includes absolute equality and approximate equality, and an acceptable range of deviation of the approximate equality may be that, for example, a difference between the two that are equal is less than or equal to 5% of either of the two.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

A backlight module of a liquid crystal display may include a lamp panel, a backboard disposed on a back side of the lamp panel and a back adhesive layer that is fixedly connected to the lamp panel and the backboard. The backboard may have a function of supporting. When the lamp panel is working, heat generated by the lamp panel needs to exchange with heat of external air via the backboard for heat dissipation, so that a temperature of the lamp panel is reduced. However, the provision of the back adhesive layer results in a low heat dissipation efficiency of the lamp panel, so that usage property of the lamp panel is affected.

In order to solve a problem of a poor heat dissipation effect of the lamp panel, the embodiments of the present disclosure provide a light-emitting module. The light-emitting module is a product capable of emitting light or a component constituting a light-emitting product. In some possible implementations, the light-emitting module may be used for lighting, and the light-emitting module may be, for example, a lamp panel or a backlight module. In some other possible implementations, the light-emitting module may be used for image display, and the light-emitting module may be, for example, a decorative wall or a traffic light.

FIG. 1 is a top view of the light-emitting module.

Referring to FIG. 1, the light-emitting module LD may include a carrier substrate 10 and a first light-emitting circuit layer 20. The carrier substrate 10 and the first light-emitting circuit layer 20 constitute the lamp panel.

The carrier substrate 10 (which may be also referred to as a substrate) may be provided according to actual needs.

For example, the carrier substrate 10 may be a rigid carrier substrate. The rigid carrier substrate may be made of glass or polymethyl methacrylate (PMMA). Alternatively, the carrier substrate 10 may be a flexible carrier substrate. The flexible carrier substrate may be made of polyethylene terephthalate (PET), polyethylene naphthalate two formic acid glycol ester (PEN), ultra-thin glass or polyimide (PI). In a case where the carrier substrate 10 is the flexible carrier substrate, the light-emitting module may be a flexible light-emitting module that is applied to a curved display apparatus.

For another example, the carrier substrate 10 may be a composite board having a heat conduction property such as a composite board with a relatively high fire-resistant material grade. The composite board may further have an insulating property. For example, the composite board may be an FR-4 epoxy glass cloth laminated board.

For example, the carrier substrate 10 may be made of a heat conduction material. In some examples, the heat conduction material may be a non-metallic heat conduction material, and the non-metallic heat conduction material may have a good insulating property. For example, the non-metallic heat conduction material may be PI. In some other examples, the heat conduction material may be a metal heat conduction material. For example, the heat conduction material may be single metal such as aluminum (Al), silver (Ag) or copper (Cu), or metal alloy such as alloy of the above single metal.

With continued reference to FIG. 1, the first light-emitting circuit layer 20 may include a plurality of circuit units 210 and a plurality of light-emitting elements 200.

The light-emitting elements 200 are each an element capable of emitting light after being powered up, and coupled to a circuit unit 210. For example, the light-emitting element 200 may be a light-emitting diode (LED), a small-sized LED, an organic light-emitting diode (OLED) or a quantum dot light emitting diode (QLED), which is not limited here. For example, the light-emitting element 200 may be a micro light-emitting device. As for a size of the micro light-emitting device, reference may be made to a size of the small-sized LED. The small-sized LED includes a submillimeter-sized LED, a micrometer-sized LED or an LED with a smaller size. The submillimeter-sized LED is also referred to as a mini light emitting diode (Mini LED), and a size (e.g., a length) of the Mini LED may be in a range from 50 micrometers to 150 micrometers. For example, the size may be in a range from 80 micrometers to 120 micrometers, or may be equal to or less than 100 micrometers. The micrometer-sized LED is also referred to as a micro light emitting diode (Micro LED). For example, a size (e.g., a length) of the Micro LED may be less than 50 micrometers. For example, the size may be in a range from 10 micrometers to 50 micrometers.

Each circuit unit 210 may be configured to be coupled to at least two light-emitting elements 200. For example, each circuit unit 210 is configured to enable at least two light-emitting elements 200 to be connected to each other in series. FIG. 1 illustrates an example where a circuit unit 210 enables four light-emitting elements 200_1, 200_2, 200_3 and 200_4 to be connected to one another in series. The at least two light-emitting elements 200 (e.g., the four light-emitting elements 200_1, 200_2, 200_3 and 200_4) coupled to the same circuit unit 210 may be referred to as a light-emitting unit 240. Since currents respectively flowing through different light-emitting units 240 may be controlled independently, it is possible to perform dimming in a local region of the light-emitting module.

In some embodiments, as shown in FIG. 1, the light-emitting units 240 may be arranged in an array. For example, the light-emitting units 240 are arranged in N rows and M columns; where N is an integer greater than 0, and M is an integer greater than 0. For example, N is greater than or equal to 2 (N≥2), and M is greater than or equal to 2 (M≥2). In FIG. 1, the direction x is a row direction, and the direction y is a column direction. The direction x and the direction y are each parallel to a plane where the carrier substrate is located (i.e., each perpendicular to a thickness direction of the carrier substrate 10), and the two intersect with each other. For example, the direction x is perpendicular to the direction y.

In some other embodiments, the light-emitting units 240 may be arranged in any other arrangement, which is not limited to a matrix arrangement. For example, the light-emitting units 240 may be arranged according to an image needed to be displayed.

As shown in FIG. 1, the first light-emitting circuit layer 20 further includes at least one driving chip 220 (e.g., one or more driving chips 220). The driving chip 220 is coupled to a circuit unit 210. A driving chip 220 (e.g., each driving chip 220) is coupled to a circuit unit 210. A driving chip 220 (e.g., each driving chip 220) may be coupled to at least two light-emitting elements 200 via a circuit unit 210 and configured to provide a driving signal for these light-emitting elements 200, so as to drive these light-emitting elements 200 to emit light (i.e., controlling a current flowing through a respective light-emitting unit 240). For example, the driving chip 220 may be a display driver integrated circuit (DDIC).

Figure 2:
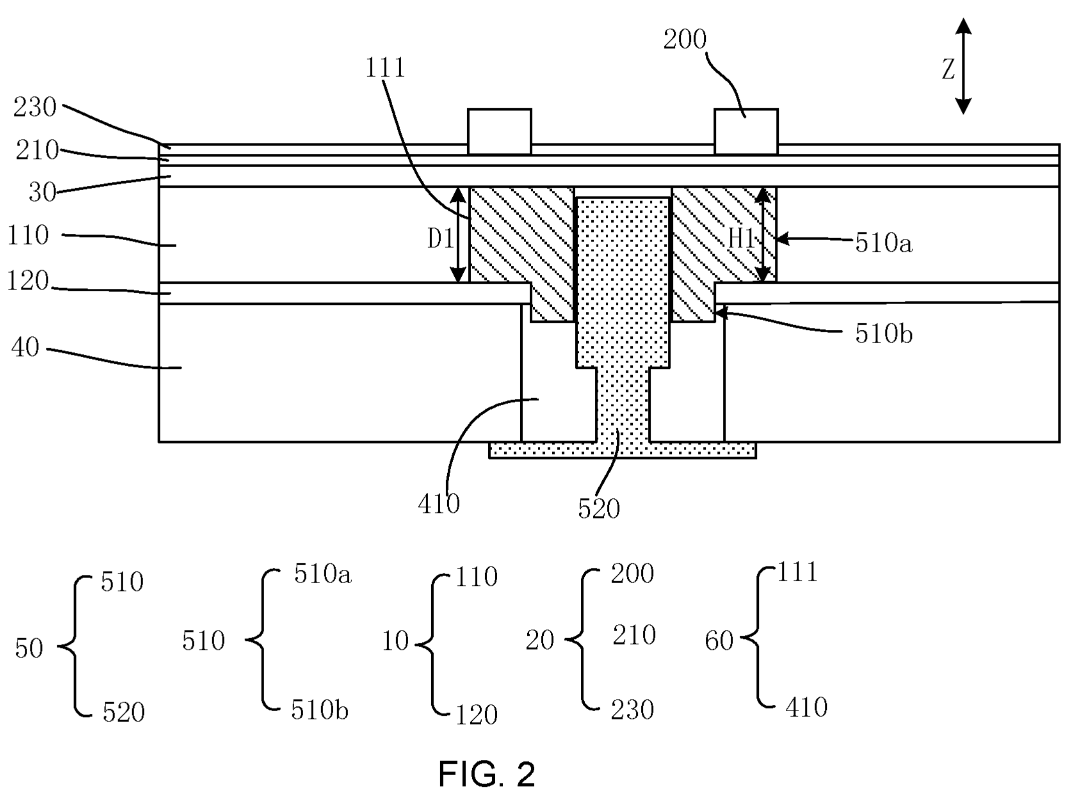
FIG. 2 is a sectional view taken along the line A1-A2 in FIG. 1, in accordance with some embodiments.

FIG. 2 is a sectional view taken along the line A1-A2 in FIG. 1.

Referring to FIG. 2, the carrier substrate 10 may include a base substrate 110 and a first protective layer 120 that are arranged in a stack. A purpose of providing the first protective layer 120 is to prevent the base substrate 110 of a metal material from being oxidized. The first protective layer 120 may be made of a non-metallic insulating heat conduction material such as green oil or white oil. The base substrate 110 may be rigid or flexible, which may refer to related descriptions of which the carrier substrate 10 is rigid or flexible. Alternatively, the base substrate 110 may be a composite board with a heat conduction property, which may refer to related descriptions of the composite board having the heat conduction property. Alternatively, the base substrate 110 may be made of a heat conduction material, which may refer to related descriptions of the heat conduction material mentioned above.

With continued reference to FIG. 2, the first light-emitting circuit layer 20 is disposed on the carrier substrate 10.

For example, the first light-emitting circuit layer 20 may be stacked on the carrier substrate 10, and the first light-emitting circuit layer 20 is in contact with the carrier substrate 10. That is, there is no other layer (which may be, for example, a protective layer or an insulating layer) provided between the first light-emitting circuit layer 20 and the carrier substrate 10. In some examples, the first light-emitting circuit layer 20 may be stacked on the carrier substrate 10 (e.g., the carrier substrate 10 made of PI or the FR-4 epoxy glass cloth laminated board) having a relatively good heat conduction property.

For another example, as shown in FIG. 2, the first light-emitting circuit layer 20 may be disposed on an intermediate insulating layer 30 provided on the carrier substrate 10. The provided intermediate insulating layer 30 may solve a problem that a surface of the carrier substrate 10 proximate to the first light-emitting circuit layer 20 is uneven. In this way, the first light-emitting circuit layer 20 is disposed on the intermediate insulating layer 30, so that orientations of lights emitted by the first light-emitting circuit layer 20 are consistent.

The intermediate insulating layer 30 may have an insulating property, a heat conduction property and an anti-peeling property. In this way, the intermediate insulating layer may achieve a purpose of insulating the first light-emitting circuit layer 20 from the carrier substrate 10. In addition, the intermediate insulating layer 30 may transmit heat generated by the first light-emitting circuit layer 20 to the carrier substrate 10, thereby achieving a heat conduction function. Moreover, a detachment, due to the heat generated by the first light-emitting circuit layer 20, between the intermediate insulating layer 30 and the carrier substrate 10 will not occur. For example, the intermediate insulating layer 30 may be an adhesive film layer. The adhesive film layer may be a layer made of a thermosetting resin (e.g., an epoxy resin).

FIG. **3*a* is a diagram showing a portion of the structure in FIG. 2. FIG. 3*b* is a diagram showing another portion of the structure in FIG. 2. Portions shown in FIGS. 3*a* and 3*b* may be combined to obtain the structure shown in FIG. 2**.

Referring to FIG. 2, the light-emitting module may further include a backboard 40, a mounting cavity 60 and a connection member 50.

The backboard 40 may be made of a material having a good heat conduction property and high hardness. In this way, the backboard 40 may achieve a function of supporting the carrier substrate 10 and may be used for heat dissipation.

For example, the backboard 40 may be made of a metal material. The metal material may be single metal (e.g., Al, Ag, Cu or iron (Fe)) or alloy (e.g., alloy of the above single metal).

Figure 3A:
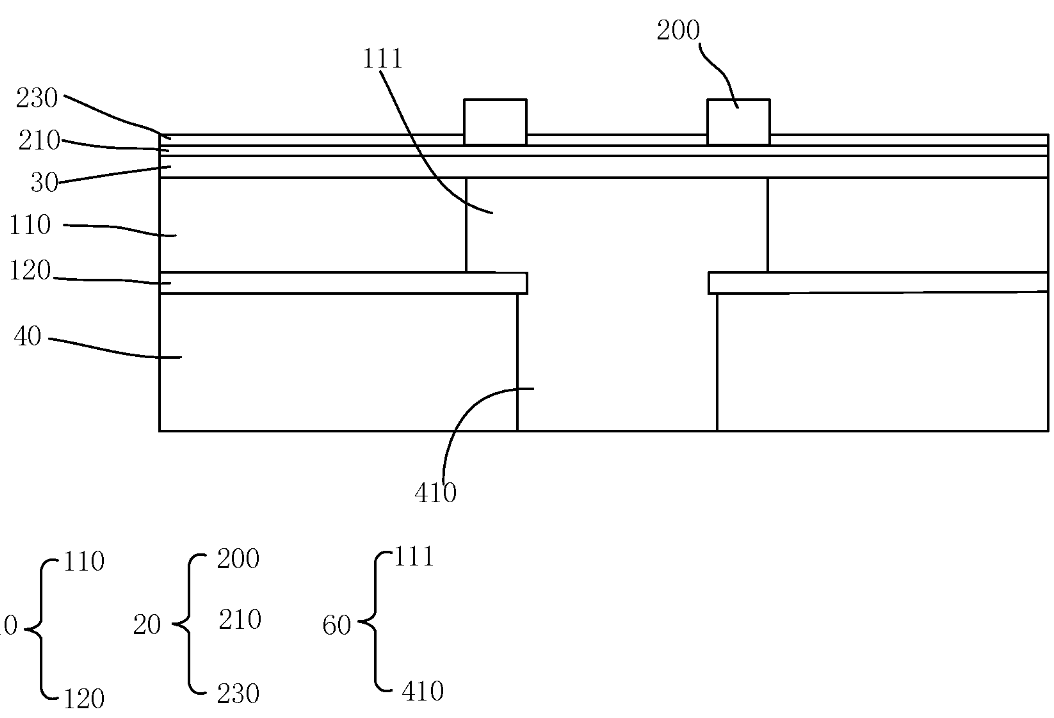
FIG. 3*a* is a diagram showing a portion of the structure in FIG. 2.
Figure 3B:
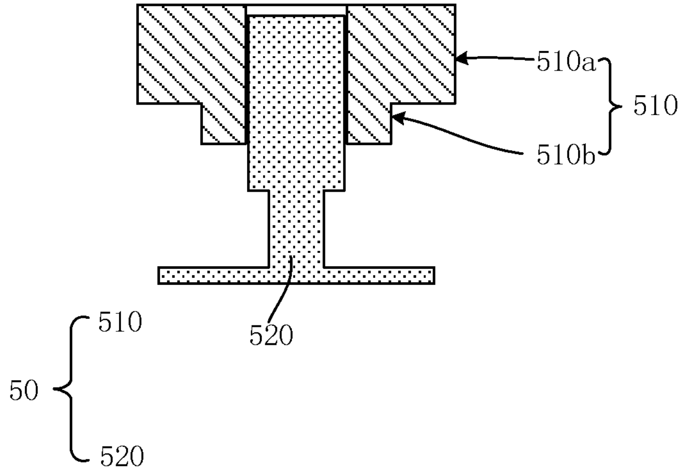
FIG. 3*b* is a diagram showing another portion of the structure in FIG. 2.

With continued reference to FIGS. 2 and 3*a*, the backboard 40 is disposed on a side of the carrier substrate 10 away from the first light-emitting circuit layer 12 and is in contact with the carrier substrate 10. In some examples, the backboard 40 may be stacked on a side of the first protective layer 120 away from the first light-emitting circuit layer 20 and be in contact with the first protective layer 120. It will be noted that there is no connection layer (e.g., an adhesive layer) provided between the backboard 40 and the carrier substrate 10; the first protective layer 120 only plays a role of protecting the base substrate 110, and does not play a role of connecting the backboard 40.

As shown in FIGS. 2 and 3*a*, in order to protect a surface of the first light-emitting circuit layer 20 away from the backboard 40, a second protective layer 230 may be provided on the surface. As for a material of the second protective layer 230, reference may be made to related descriptions of the first protective layer 120.

As shown in FIGS. 2 and 3*a*, the mounting cavity 60 is disposed in at least one of the backboard 40 and the carrier substrate 10, and an inner wall of the mounting cavity 60 is enclosed by both the backboard 40 and the carrier substrate 10. As shown in FIG. 2, the connection member 50 is disposed in the mounting cavity 60 and fixedly connected to the carrier substrate 10 and the backboard 40.

Based on the above descriptions, a comparison solution that is easy to be conceived of is that a back adhesive layer (e.g., an easy-to-pull adhesive layer or an adhesive layer constituted by a copper layer and a double-sided adhesive tape) is provided to enable the backboard 40 to be fixedly connected to the carrier substrate 10. The back adhesive layer in the comparison solution plays a role of not only being fixedly connected to the backboard 40 and the carrier substrate 10, but also blocking a transfer of heat. For example, the heat generated by the first light-emitting circuit layer exchanges with heat of outside world (e.g., heat of external air) passing through the carrier substrate 10, the back adhesive layer and the backboard 40 in sequence.

In this embodiment, the backboard 40 may be in direct contact with the carrier substrate 10, and the backboard 40 is fixedly connected to the carrier substrate 10 via the connection member 50. In this way, the heat generated by the first light-emitting circuit layer exchanges with the heat of outside world (e.g., the heat of external air) passing through the carrier substrate 10 and the backboard 40 in sequence.

Figure 4:
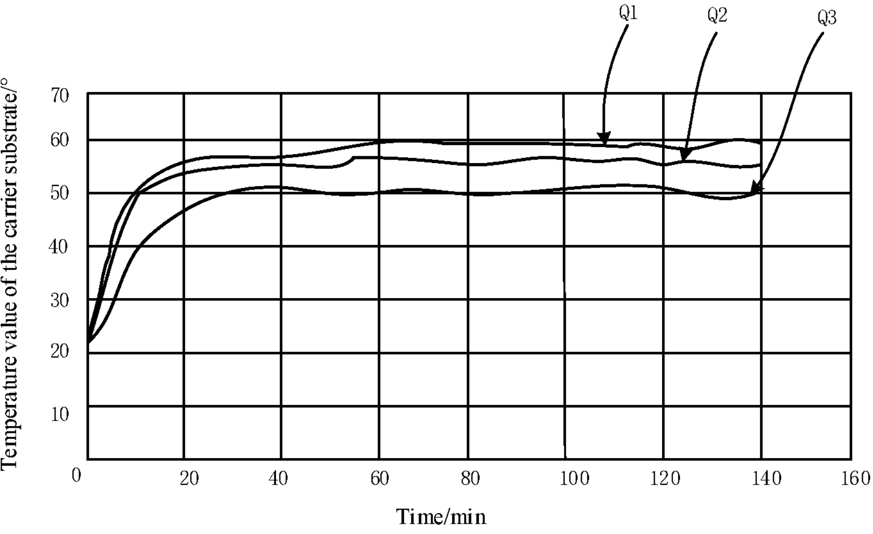
FIG. 4 is a diagram showing variations in temperature of carrier substrates with time, in accordance with some embodiments.

Referring to FIG. 4, in FIG. 4, the curve Q1 represents a curve showing a variation in temperature of the carrier substrate in the comparison solution in which a back adhesive layer is the easy-to-pull adhesive layer; the curve Q2 represents a curve showing a variation in temperature of the carrier substrate in the comparison solution in which a back adhesive layer is the adhesive layer constituted by the copper layer and the double-sided adhesive tape; the curve Q3 represents a curve showing a variation in temperature of the carrier substrate in this embodiment in which a bolt and a nut are used to connect the backboard to the carrier substrate.

It can be seen from FIG. 4 that the temperature of the carrier substrate 10 in this embodiment is lower than the temperature of the carrier substrate in the comparison solution. That is, in this embodiment, the connection member 50 is located in the mounting cavity, and the backboard 40 is fixedly connected to the carrier substrate 10. In this way, the back adhesive layer is omitted, which shortens a path of the transfer of heat, so that the heat may rapidly exchange with the heat of external air. As a result, a heat dissipation efficiency of this embodiment is higher than that of the comparison solution. In addition, the mounting cavity is located within contours of the carrier substrate 10 and the backboard 40, so that a structure of which the carrier substrate 10 is connected to the backboard 40 is compact.

The connection member 50 may be a part, such as a fastener. The connection member 50 may include two parts. Referring to FIG. 3*b*, the connection member 50 includes, for example, a first connection portion 510 and a second connection portion 520 that are matched with each other.

Figure 5:
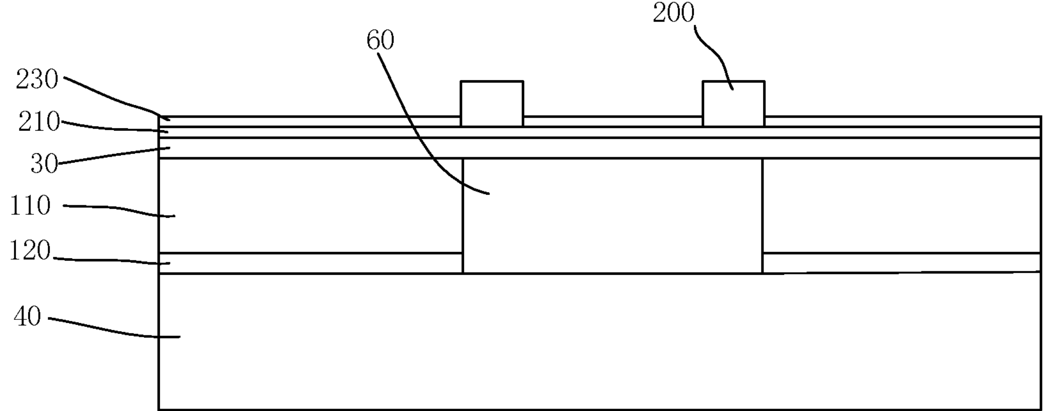
FIG. 5 is a structural diagram of a mounting cavity, in accordance with some embodiments.
Figure 6:
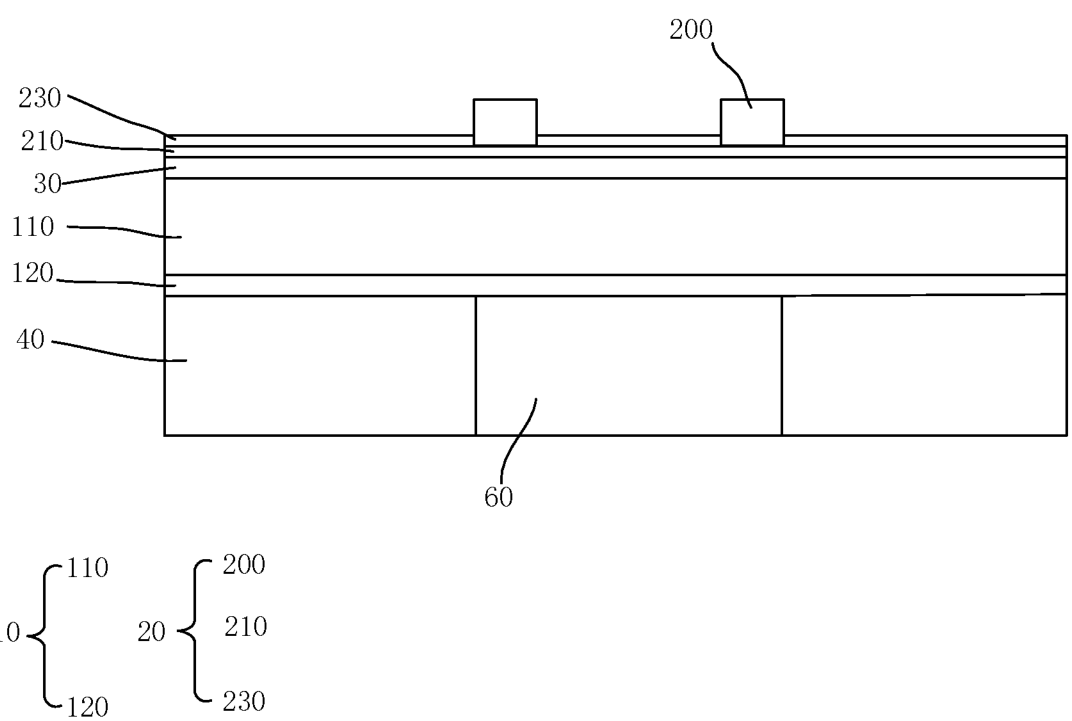
FIG. 6 is a structural diagram of another mounting cavity, in accordance with some embodiments.

FIG. 5 is a diagram showing an alternative structure of the structure in FIG. 3*a*. FIG. 6 is a diagram showing another alternative structure of the structure in FIG. 3*a*.

The mounting cavity is disposed in at least one of the backboard 40 and the carrier substrate 10, and the inner wall of the mounting cavity is enclosed by both the backboard and the carrier substrate 10.

For example, referring to FIG. 5, the mounting cavity 60 may include a surface of the backboard 40 proximate to the carrier substrate 10 and a surface of the carrier substrate 10 that is proximate to the backboard 40 and concaved inwards. The surface of the carrier substrate 10 that is proximate to the backboard 40 and concaved inwards is referred to as a first concaved portion, and the surface of the backboard 40 proximate to the carrier substrate 10 is referred to as a first closed surface. Thus, the first concaved portion and the first closed surface constitute the mounting cavity 60 (which is referred to as a first mounting cavity).

For another example, referring to FIG. 6, the mounting cavity 60 may include a surface of the backboard 40 that is proximate to the carrier substrate 10 and concaved inwards and a surface of the carrier substrate 10 proximate to the backboard 40. The surface of the backboard 40 that is proximate to the carrier substrate 10 and concaved inwards is referred to as a second concaved portion, and the surface of the carrier substrate 10 proximate to the backboard 40 is referred to as a second closed surface. Thus, the second concaved portion and the second closed surface constitute the mounting cavity 60 (which is referred to as a second mounting cavity).

For another example, referring to FIGS. 2 and 3*a*, the mounting cavity 60 may include a mounting groove 111 disposed in the carrier substrate 10 and a via hole 410 penetrating the backboard 40. An opening of the mounting groove 111 is disposed in a surface of the carrier substrate 10 proximate to the backboard 40, and at least a portion of the connection member 50 is fixed in the mounting groove 111. The connection member 50 extends to a side of the backboard 40 away from the carrier substrate 10 through the via hole 410 and is in contact with a surface of the backboard 40 away from the carrier substrate 10. In a possible implementation, the mounting groove 111 penetrates the carrier substrate 10. That is, the mounting groove 111 may be another via hole.

In a possible implementation, a connection member 50 (i.e., a part) is disposed in the first mounting cavity and fixedly connected to the carrier substrate 10 and the backboard 40. For example, a fastener (e.g., a plastic fastener) may be disposed on the first closed surface, the first concaved portion may be a fastener groove, and the carrier substrate 10 is in contact with and fixedly connected to the backboard 40 after the fastener is inserted into the fastener groove. In another possible implementation, a connection member 50 (i.e., a fastener) is disposed in the second mounting cavity and fixedly connected to the carrier substrate 10 and the backboard 40. For example, a fastener (e.g., a plastic fastener) may be disposed on the second closed surface, the second concaved portion may be a fastener groove, and the carrier substrate 10 is in contact with and fixedly connected to the backboard 40 after the fastener is inserted into the buckle groove.

In another possible implementation, with continued reference to FIG. 2, at least a portion of the first connection portion 510 is fixed in the mounting groove 111, and the second connection portion 520 is fixedly connected to the backboard 40 and the first connection portion 510. In this case, the mounting groove 111 may be the another via hole.

The first connection portion 510 may be a nut such as a rivet nut or a hex nut. The second connection portion 520 may be a screw such as a hex head screw, a lag screw or a round head screw. A detachable connection may be achieved by a threaded connection between the nut and the screw, so that the backboard 40 and the carrier substrate 10 are detachable.

As shown in FIGS. 2 and 3*b*, the first connection portion 510 (e.g., the nut) may include a fixing portion 510*a* and a positioning portion 510*b* that are connected to each other. As shown in FIG. 2, the at least a portion of the first connection portion 510 may be the fixing portion 510*a*. That is, the fixing portion 510*a* is fixedly disposed in the mounting groove 111 (which may be the another via hole). The positioning portion 510*b* is located in the via hole 410. The provided fixing portion 510*a* is used for fixing the first connection portion 510 in the carrier substrate 10. The positioning portion 510*b* may play a role of positioning the carrier substrate 10 and the backboard 40, so as to accelerate installation of the carrier substrate 10 and the backboard 40. In some possible implementations, the first connection portion 510 may be the nut, and the second connection portion 520 may be the screw, and the provided fixing portion 510*a* and the provided positioning portion 510*b* may cause a thread length of the nut to be relatively long. Thus, when the nut is threaded connected to the screw, a thread engagement length between the screw and nut is relatively long, so that the connection is strong.

In some examples, as shown in FIG. 2, a height H1 of the fixing portion 510*a* in an axial direction Z thereof is substantially equal to a depth D1 of the mounting groove 111 (which may be the another via hole). For example, the height H1 of the fixing portion 510*a* in the axial direction Z thereof is equal to the depth D1 of the mounting groove 111 (which may be the another via hole). For another example, the height H1 of the fixing portion 510*a* in the axial direction Z thereof is less than the depth D1 of the mounting groove 111 (which may be the another via hole). In a possible implementation, a surface of the fixing portion 510*a* away from the backboard 40 is flush with a surface of the carrier substrate away from the backboard 40. In this way, after the intermediate insulating layer 30 is provided, a surface of the intermediate insulating layer 30 away from the backboard 40 is relatively flat.

In some examples, as shown in FIG. 2, the positioning portion 510*b* is in clearance fit with the via hole 410.

In some examples, as shown in FIG. 2, the fixing portion 510*a* is riveted to the mounting groove 111 (which may be the another via hole). For example, the nut is riveted to the mounting groove 111 (which may be the another via hole).

It may be possible to provide a plurality of connection members 50 (e.g., two or at least three) according to sizes and materials of the backboard 40 and the carrier substrate 10. A distance between two adjacent connection members 50 (which may be, for example, a distance between center lines, center axises or contour lines of the connection members) is in a range from 120 mm to 130 mm, inclusive. The distance may be, for example, 120 mm, 122 mm, 123 mm, 125 mm, 126 mm, 129 mm or 130 mm. The plurality of connection members 50 are arranged according to the distance, so that connection firmness (i.e., contact tightness) between the carrier substrate 10 and the backboard 40 is relatively good. In this way, it is possible to avoid an air heat-insulating layer formed between the carrier substrate 10 and the backboard 40. That is, the carrier substrate 10 and the backboard 40 will not be inflated. The connection member 50 may include the first connection portion 510 (e.g., the nut) and the second connection portion 520 (e.g., the screw).

The light-emitting unit will be described in detail below.

Figure 7:
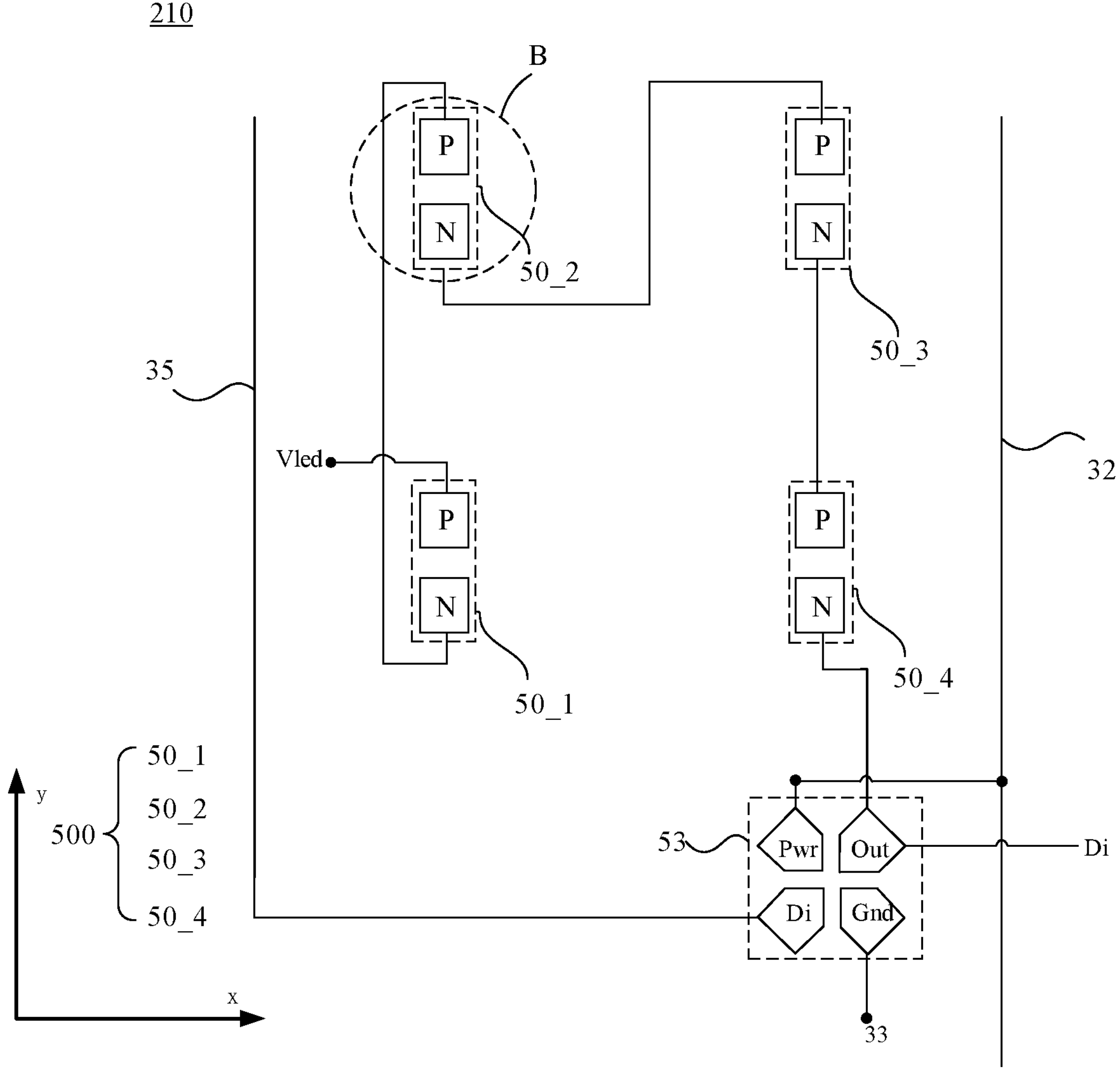
FIG. 7 is an equivalent circuit diagram of a light-emitting unit, in accordance with some embodiments.

FIG. 7 is an equivalent circuit diagram of the light-emitting unit. Referring to FIG. 7, a circuit unit 210 (e.g., each circuit unit 210) includes a driving voltage terminal Vled and a circuit unit pad set, and may further include a driving chip pad group 53.

The driving voltage terminal Vled is configured to provide a driving voltage. For example, the driving voltage terminal Vled is configured to provide a high voltage in a case where multiple light-emitting elements (i.e., at least two light-emitting elements, such as four light-emitting elements) coupled to the circuit unit 210 need to emit light.

The driving chip pad group 53 is configured to be coupled to a driving chip 220 (as shown in FIG. 1), and receive a driving signal from the driving chip 220. For example, in the case where the multiple light-emitting elements coupled to the circuit unit 210 need to emit light, the driving chip 220 provides the driving signal for the light-emitting elements via the driving chip pad group 53, so as to control a driving current flowing through the light-emitting elements.

The circuit unit pad set includes a plurality of light-emitting element pad groups 500 that are connected in series, two ends of the circuit unit pad set (i.e., two ends of the plurality of light-emitting element pad groups 500) are respectively coupled to the driving voltage terminal Vled and the driving chip pad group 53, so that the multiple light-emitting elements 200 coupled to the circuit unit 210 may be connected in series.

For example, as shown in FIG. 7, each light-emitting element pad group 500 includes an anode pad P and a cathode pad N; the circuit unit 210 includes four light-emitting element pad groups 50_1, 50_2, 50_3 and 50_4, and the four light-emitting element pad groups are connected in series via respective anode pads P and cathode pads N. An anode pad P of the light-emitting element pad group 50_1 (i.e., an anode pad P located on an end of the circuit unit pad set) is coupled to the driving voltage terminal Vled, and a cathode pad N of the light-emitting element pad group 50_4 (i.e., a cathode pad N located on the other end of the circuit unit pad set) is coupled to the driving chip pad group 53.

In addition, the number of light-emitting element pad groups 500 in each circuit unit 210 is not limited, which may be set according to actual needs. For example, the number may be 2, 4, 5 or 8. The light-emitting element pad groups 500 in each circuit unit 210 may be arranged in an array (e.g., arranged in a matrix). Of course, an arrangement of the light-emitting element pad groups 500 may be set according to needs. For example, the light-emitting element pad groups 500 are arranged in a circle.

For example, with continued reference to FIG. 7, in the first light-emitting circuit layer, the multiple light-emitting elements 200 are mounted in the circuit unit 210. Each light-emitting element 200 of the multiple light-emitting elements 200 is coupled to a light-emitting element pad group 500 (as shown in FIG. 7) in the circuit unit 210. In some embodiments, an anode of a light-emitting element 200 (e.g., each light-emitting element 200) is coupled to an anode pad P of a light-emitting element pad group 500, and a cathode of the light-emitting element 200 is coupled to a cathode pad N of the light-emitting element pad group 500, so that the light-emitting element 200 is coupled to the light-emitting element pad group 500.

Figure 8:
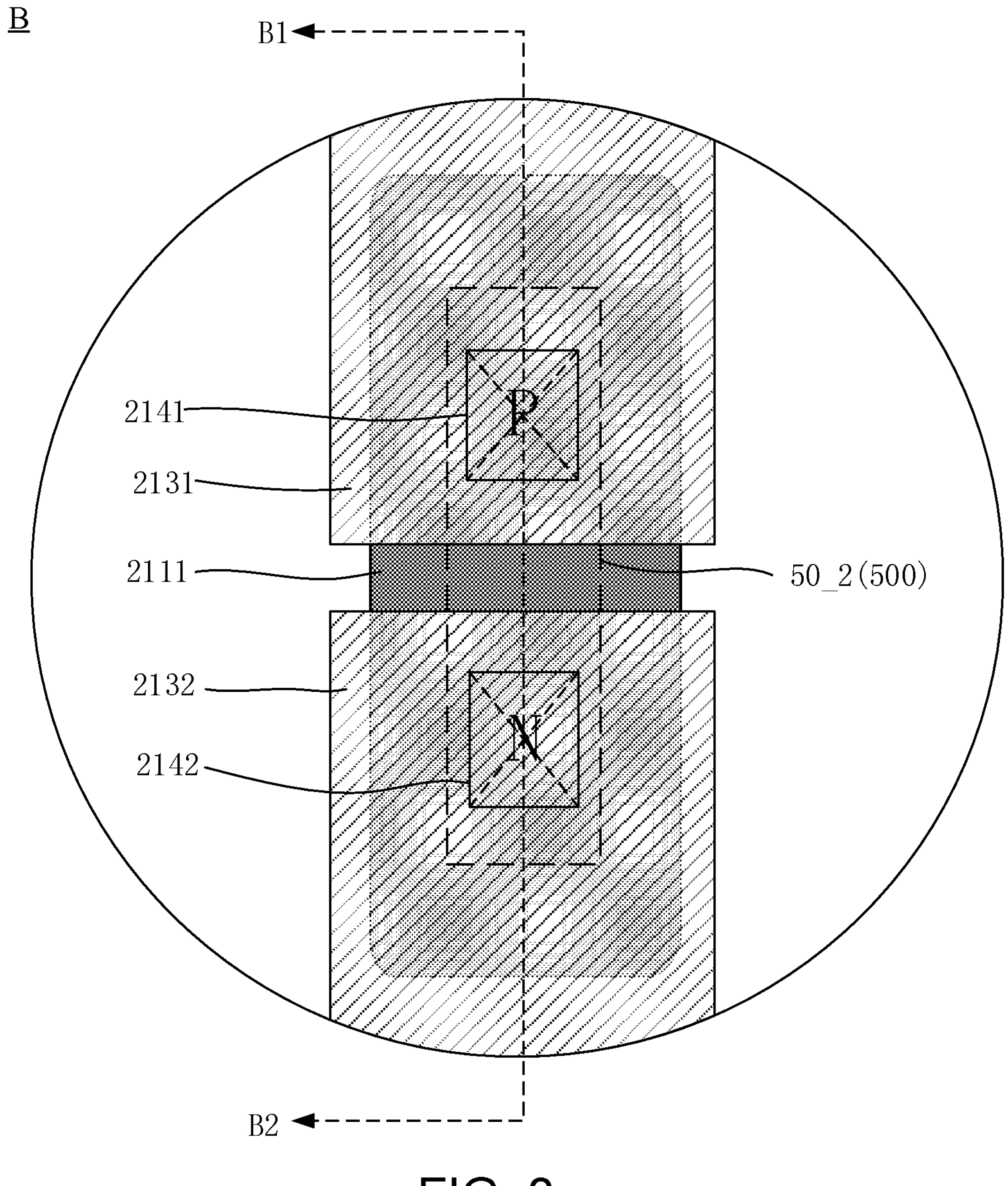
FIG. 8 is an enlargement view showing a structure of the part B in FIG. 7, in accordance with some embodiments.
Figure 9:
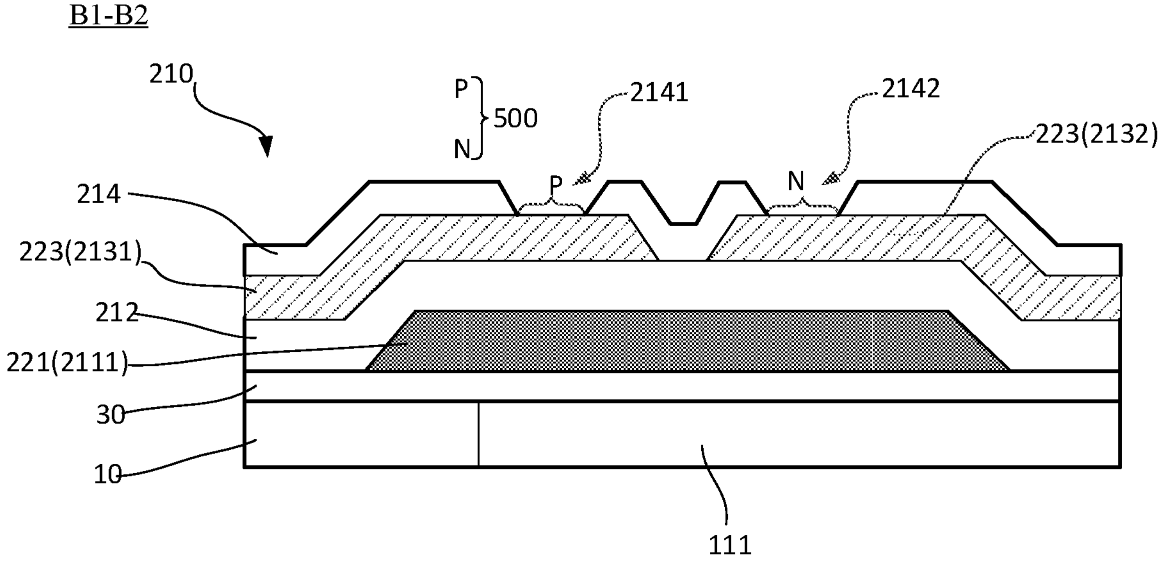
FIG. 9 is a sectional view taken along the line B1-B2 in FIG. 8, in accordance with some embodiments.

FIG. 8 is an enlargement view showing a structure of the part B in the circuit unit shown in FIG. 7. FIG. 9 is a sectional view taken along the line B1-B2 in FIG. 8.

Referring to FIG. 8, in some embodiments, the circuit unit 210 further includes at least one pad support (which is also referred to as a support pattern) 2111, and a pad support 2111 corresponds to a light-emitting element pad group 500 and is located on a side of the light-emitting element pad group 500 proximate to the base substrate. In a possible implementation, the pad support 2111 is located directly below the light-emitting element pad group 500. For example, an orthographic projection of the light-emitting element pad group 50_2 on the base substrate is located within an orthographic projection of the pad support 2111 on the base substrate.

Figure 10:
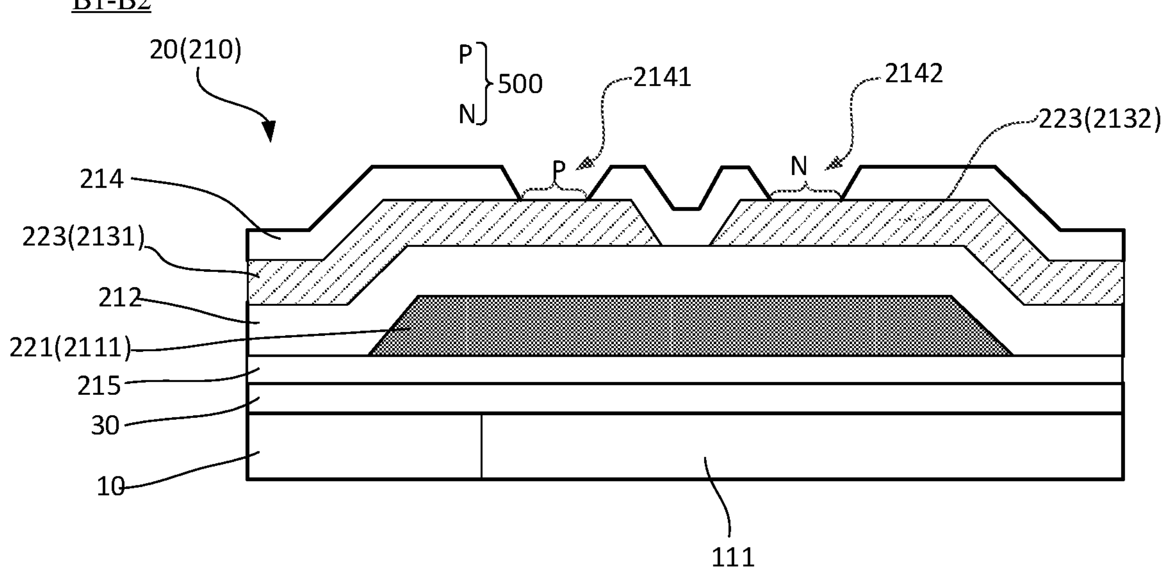
FIG. 10 is another sectional view taken along the line B1-B2 in FIG. 8, in accordance with some embodiments.

Referring to FIGS. 9 and 10, according to an arrangement of film layers included in the circuit unit 210, the circuit unit 210 may include a first conductive layer 221, a first insulating layer 212, a second conductive layer 223 and a second insulating layer 214 that are sequentially stacked on the carrier substrate 10 (e.g., the base substrate), and the first conductive layer 221 is closer to the carrier substrate 10 than the second conductive layer 223. In some examples, as shown in FIG. 9, the first conductive layer 221 may be stacked on the intermediate insulating layer 30. That is, the intermediate insulating layer 30 is located between the carrier substrate 10 and the first conductive layer 221.

The first insulating layer 212 and the second insulating layer 214 may be each made of at least one of silicon nitride and silica, and the two may be each of a single-layer structure or a multi-layer structure. For example, the multi-layer structure may include a double-layer structure stacked by a silica layer and a silicon nitride layer. The first conductive layer 221 or the second conductive layer 223 may be made of a material of single metal such as Cu, Al, molybdenum (Mo), titanium (Ti), chromium (Cr) or tungsten (W), or may be made of a material of alloy formed of at least two of the above single metal, which is not limited here.

As shown in FIGS. 9 and 10, the pad support 2111 may be located in the first conductive layer 221, and the light-emitting element pad group 500 in the circuit unit 210 may be located in the second conductive layer 223.

A light-emitting element pad group 500 includes an anode layer 2131 and a cathode layer 2132, and the anode layer 2131 and the cathode layer 2132 are not in contact with each other (that is, the anode layer 2131 and the cathode layer 2132 are separated); the second insulating layer 214 is provided with a plurality of first via holes 2141 and a plurality of second via holes 2142 therein.

For example, a first via hole 2141 and a second via hole 2142 may be disposed in a region, opposite to a light-emitting element pad group 500, of the second insulating layer 214. A portion of the anode layer 2131 exposed by the first via hole 2141 serves as an anode pad P, and a portion of the cathode layer 2132 exposed by the second via hole 2142 serves as a cathode pad N. For example, as shown in FIGS. 9 and 10, in the second conductive layer 223, the anode layer 2131 is located on a left side, and the cathode layer 2132 is located on a right side. Accordingly, in the second insulating layer 214, the first via hole 2141 is located on the left side, and the second via hole 2142 is located on the right side.

FIG. 10 is a diagram showing an alternative structure of the structure in FIG. 9.

Referring to FIG. 10, the first light-emitting circuit layer 20 further includes a buffer layer 215, and the buffer layer 215 may be stacked on the intermediate insulating layer 30. That is, the buffer layer 215 is located between the intermediate insulating layer 30 and the first conductive layer 221. The buffer layer 215 has a buffer function. For example, the buffer layer 215 is made of a buffer material.

Figures 11, 12:
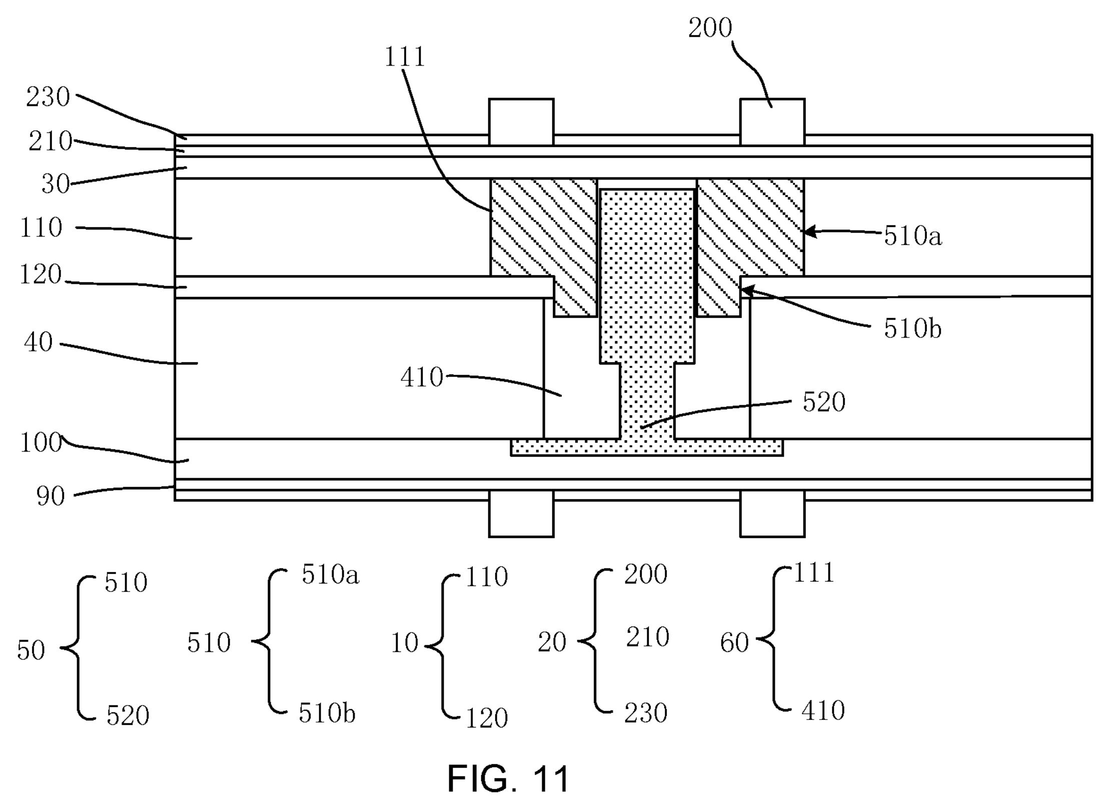
FIG. 11 is a diagram showing an alternative structure of the structure in FIG. 2.
FIG. 12 is a structural diagram of a display apparatus, in accordance with some embodiments.

FIG. 11 is a diagram showing an alternative structure of the structure in FIG. 2.

Referring to FIG. 11, the light-emitting module further includes a second light-emitting circuit layer 90.

As for a structure of the second light-emitting circuit layer 90, reference may be made to related descriptions of the first light-emitting circuit layer 20, which will not be repeated here. The second light-emitting circuit layer 90 may be disposed on the side of the backboard 40 away from the carrier substrate 10. For example, the first light-emitting circuit layer 20 and the second light-emitting circuit layer 90 are arranged in a mirroring manner, so that the light-emitting module may emit light on two sides (that is, the first light-emitting circuit layer and the second light-emitting circuit layer may both emit light). In some examples, the second light-emitting circuit layer 90 and the backboard 40 are provided with a third insulating layer 100 therebetween. As for a structure and a material of the third insulating layer 100, reference may be made to related descriptions of the intermediate insulating layer 30.

FIG. 12 is a structural diagram of a display apparatus.

Some embodiments of the present disclosure further provide a display apparatus. The display apparatus refers to a product having a function of image display. For example, the display apparatus may be any one of a display, a television, a billboard, a digital photo frame, a laser printer having a display function, a telephone, a mobile phone, a tablet computer, a personal digital assistant (PDA), a digital camera, a portable camcorder, a view finder, a monitor, a vehicle-mounted screen, a navigator, a vehicle, a large-area wall, a household appliance and an information inquiry device (e.g., a business inquiry device for a department of e-government, bank, hospital, electricity or the like).

Referring to FIG. 12, the display apparatus 1000 includes a display panel DP and a light-emitting module LD. The display panel DP may be, for example, a liquid crystal display panel. The light-emitting module LD may be the light-emitting module provided in any one of the above embodiments, and the light-emitting module LD is located on a side of the display panel DP away from a display side thereof, and is configured to provide backlight for the display panel DP. As for a structure of the light-emitting module LD, reference may be made to the above descriptions. The display side of the display panel DP is a side of the display panel DP used for the image display.

For example, as shown in FIG. 12, the display apparatus 1000 may further include at least one film CC (e.g., one or more films) disposed between the display panel DP and the light-emitting module LD. For example, the film CC may include at least one of a scatter sheet, a prism sheet and a scatter board.

Referring to FIG. 13, some embodiments provide a method of manufacturing a light-emitting module, and the method includes the following steps.

In S1, a first light-emitting circuit layer is formed on a carrier substrate. As for a structure of the first light-emitting circuit layer, reference may be made to the related descriptions of the first light-emitting circuit layer mentioned above.

In S2, a backboard is provided on a side of the carrier substrate away from the first light-emitting circuit layer, and the backboard is in contact with the carrier substrate; a mounting cavity is provided in at least one of the backboard and the carrier substrate, and an inner wall of the mounting cavity is enclosed by both the backboard and the carrier substrate.

For example, the mounting cavity includes a mounting groove disposed in the carrier substrate and a via hole penetrating the backboard, and an opening of the mounting groove is disposed in a surface of the carrier substrate proximate to the backboard.

In S3, a connection member is provided in the mounting cavity, so that the connection member is fixedly connected to the carrier substrate and the backboard.

For example, the connection member includes a first connection portion and a second connection portion. Based on this, S3 includes: fixing at least a portion of the first connection portion in the mounting groove; and making the second connection portion pass through the via hole and matched with the first connection portion, so that the connection member is fixedly connected to the carrier substrate and the backboard. The backboard is in contact with the carrier substrate.

In some examples, the mounting groove penetrates the carrier substrate. The mounting groove is a via hole. In this case, for the convenience of the description, the mounting groove may be referred to as the via hole below.

Based on this, before the first light-emitting circuit layer is formed on the carrier substrate, the method of manufacturing the light-emitting module further includes the following step.

In S0, a hole plug is inserted into the via hole of the carrier substrate, an intermediate insulating layer is formed on the carrier substrate, and then the hole plug in the via hole is removed. In this way, during the intermediate insulating layer is formed, it is possible to avoid a failure in mounting the first connection portion caused by a fact that the intermediate insulating layer enters the via hole and blocks the via hole.

Correspondingly, S1 includes forming the first light-emitting circuit layer on a side of the intermediate insulating layer away from the carrier substrate.

A relatively specific method of manufacturing the light-emitting module will be described below. The method of manufacturing the light-emitting module may include S21 to S28.

In S21, referring to FIG. 14*a*, a hole plug 80 is inserted into a mounting groove (e.g., a via hole) 111 of a base substrate 110.

In some examples, after the hole plug 80 is inserted into the mounting groove 111, an anti-adhesion film is formed between the hole plug 80 and the mounting groove 111. The anti-adhesion film may facilitate a removal of the hole plug 80 from the mounting groove 111.

For example, the mounting groove 111 of the base substrate 110 is coated with an anti-adhesion agent, and the anti-adhesion film is formed between the hole plug 80 and the mounting groove 111 after the hole plug 80 is inserted into the mounting groove 111. For another example, a surface of the hole plug 80 is coated with an anti-adhesion agent, and the anti-adhesion film is formed between the hole plug 80 and the mounting groove 111 after the hole plug 80 is inserted into the mounting groove 111.

The anti-adhesion agent may be a high temperature resistant and high pressure resistant anti-adhesion agent. The high temperature resistant and high pressure resistant anti-adhesion agent may be, for example, silicone oil or inorganic powder.

It will be noted that the hole plug 80 is flush with a surface (e.g., an upper surface shown in FIG. 14*b*) of the base substrate 110. That is, the hole plug 80 is flush with a surface of the base substrate 110 away from the backboard.

Figure 14B:
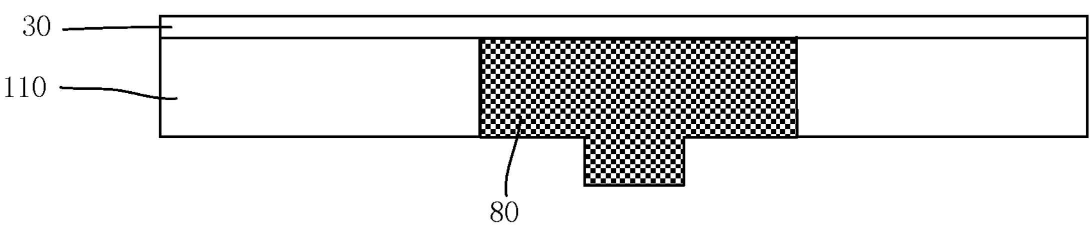
FIG. 14*b* is a structural diagram of a base substrate, a hole plug and an intermediate insulating layer, in accordance with some embodiments.

In S22, referring to FIG. 14*b*, an intermediate insulating layer 30 is stacked on the base substrate 110 (e.g., an upper surface shown in the figure) shown in FIG. 14*a*.

For example, the intermediate insulating layer 30 may be an adhesive film layer. Under a first condition, the adhesive film layer turns into a molten state and is laid on the base substrate 110; under a second condition, the adhesive film layer in the molten state is cured on the base substrate 110. In this process, the hole plug 80 and the adhesive film layer will not be cured to be of a one-piece structure by using the high temperature resistant and high pressure resistant anti-adhesion agent, which facilitates the removal of the hole plug 80.

In a possible implementation, the adhesive film layer is made of an epoxy resin; under a condition of which a temperature is in a range from 100° C. to 120° C., inclusive (e.g., 100 ° C., 110° C. or 120° C.) and a pressure is in a range from 3 kg/cm$^2$ to 5 kg/cm$^2$, inclusive (e.g., 3 kg/cm$^2$, 4 kg/cm$^2$ or 5 kg/cm$^2$), the adhesive film layer made of the epoxy resin turns into the molten state and is laid on the base substrate 110; under another condition of a room temperature and an atmospheric pressure, the adhesive film layer in the molten state is cured on the base substrate 110. In this way, a detachment, due to heat generated by the first light-emitting circuit layer, between the base substrate 110 and the intermediate insulating layer 30 will not occur.

Figure 14C:
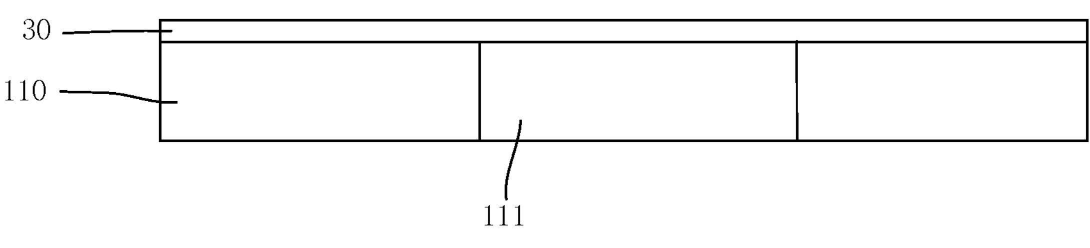
FIG. 14*c* is a structural diagram of a base substrate and an intermediate insulating layer, in accordance with some embodiments.

In S23, referring to FIG. 14*c*, on the basis of the structure in FIG. 14*b*, the hole plug 80 is removed from the mounting groove 111 in the base substrate 110. It will be noted that, after the hole plug 80 is removed, the anti-adhesion film may remain in the mounting groove 111. Thus, in the manufactured light-emitting module, there may be the anti-adhesion film between the mounting groove 111 and the connection member (e.g., the first connection portion). Of course, the anti-adhesion film may be removed.

Figure 14D:
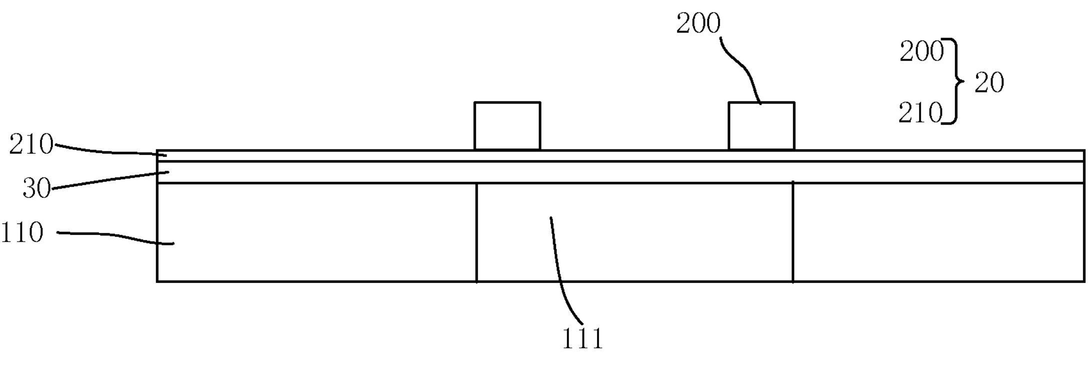
FIG. 14*d* is a diagram showing a structure of which a first light-emitting circuit layer is disposed on an intermediate insulating layer, in accordance with some embodiments.

In S24, referring to FIG. 14*d*, on the basis of the structure in FIG. 14*c*, the first light-emitting circuit layer 20 is disposed on a side of the intermediate insulating layer 30 away from the base substrate 110. As for a structure of which the first light-emitting circuit layer 20 is disposed on the intermediate insulating layer 30 and a structure of the first light-emitting circuit layer 20, reference may be made to the related descriptions mentioned above.

Figure 14E:
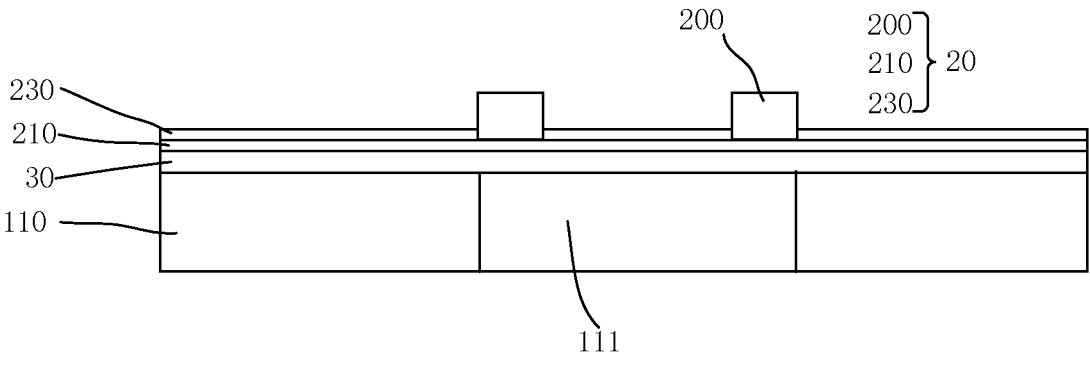
FIG. 14*e* is a diagram showing a structure of which a second protective layer is disposed on a first light-emitting circuit layer, in accordance with some embodiments.

In S25, referring to FIG. 14*e*, on the basis of the structure in FIG. 14*d*, a second protective layer 230 is provided on a side of the first light-emitting circuit layer 20 away from the base substrate 110. As for a material of the second protective layer 230, reference may be made to the related descriptions mentioned above.

In S26, referring to FIG. 14*f*, at least a portion of a first connection portion 510 is fixed in the mounting groove 111 of the structure shown in FIG. 14*e*.

For example, as shown in FIG. 14*f*, the first connection portion 510 includes a fixing portion 510*a* and a positioning portion 510*b*. The fixing portion 510*a* is fixed in the mounting groove 111, and a surface of the fixing portion 510*a* proximate to the intermediate insulating layer 30 is flush with the surface of the base substrate 110 proximate to the intermediate insulating layer 30.

In S27, referring to FIG. 14*g*, on the basis of the structure in FIG. 14*f*, a first protective layer 120 is provided on a side of the base substrate 110 away from the intermediate insulating layer 30. In this case, the base substrate 110 and the first protective layer 120, as a whole, may be referred to as the carrier substrate. As for the first protective layer 120, reference may be made to the related descriptions mentioned above.

Figure 14H:
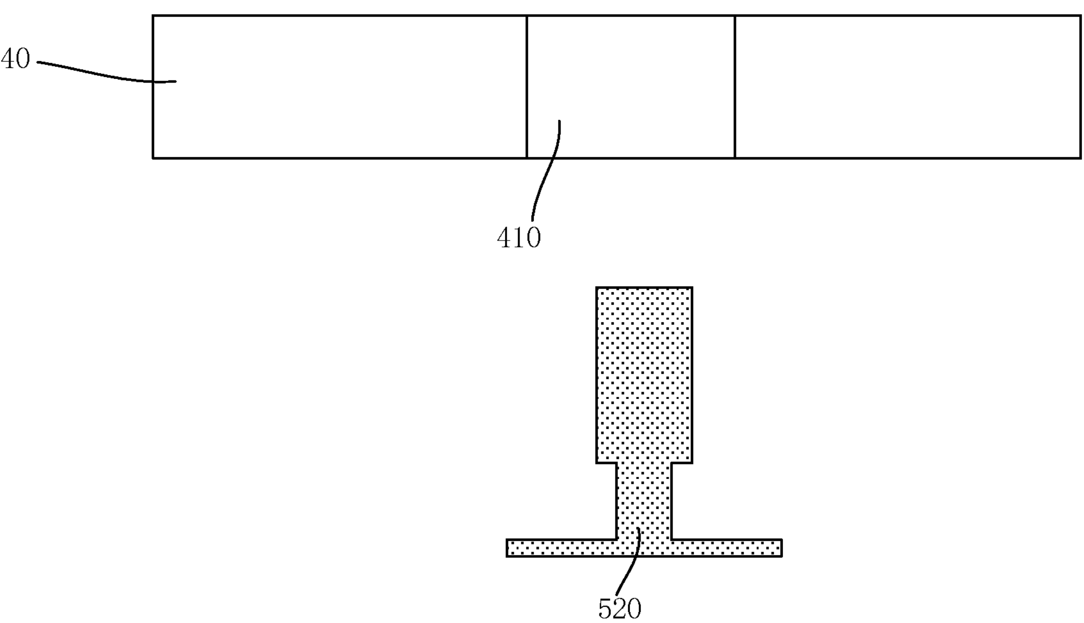
FIG. 14*h* is a diagram showing a structure of yet another portion of a light-emitting module, in accordance with some embodiments.
Figure 14I:
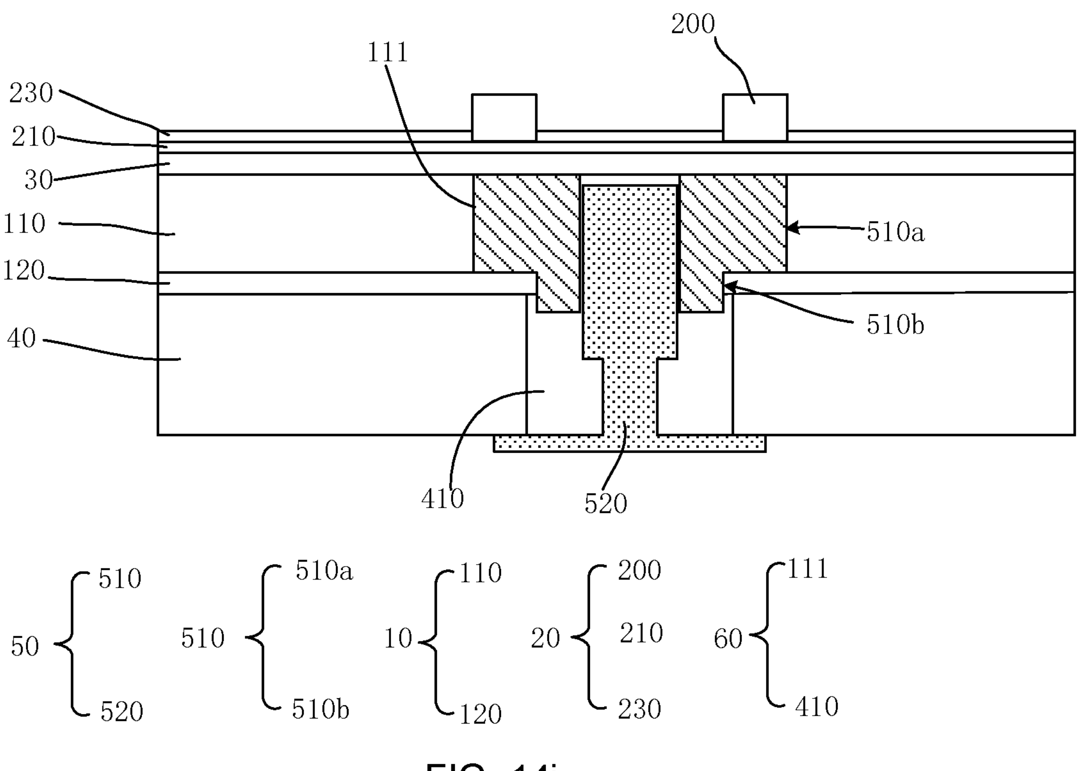
FIG. 14*i* is a structural diagram of a light-emitting module, in accordance with some embodiments.

In S28, referring to FIG. 14*i*, a second connection portion 520 shown in FIG. 14*h* is fixedly connected to the first connection portion 510 shown in FIG. 14*g* through a via hole 410 of a backboard 40 shown in FIG. 14*h*, so that the light-emitting module in the embodiments is manufactured.

It will be noted that S23 may be performed between S24 and S25. Alternatively, S23 may be performed between S25 and S26.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting module, comprising:

a carrier substrate;

a first light-emitting circuit layer stacked on the carrier substrate;

a backboard disposed on a side of the carrier substrate away from the first light-emitting circuit layer and in direct contact with the carrier substrate;

a mounting cavity disposed in at least one of the backboard and the carrier substrate, and an inner wall of the mounting cavity being enclosed by both the backboard and the carrier substrate; and at least one connection member, a connection member being disposed in the mounting cavity and fixedly connected to the carrier substrate and the backboard.

2. The light-emitting module according to claim 1, wherein the mounting cavity includes:

a mounting groove disposed in the carrier substrate, wherein an opening of the mounting groove is disposed in a surface of the carrier substrate proximate to the backboard, at least a portion of the connection member is fixed in the mounting groove; and a via hole penetrating the backboard, wherein the connection member extends to a side of the backboard away from the carrier substrate through the via hole and is in contact with a surface of the backboard away from the carrier substrate.

3. The light-emitting module according to claim 2, wherein the mounting groove penetrates the carrier substrate.

4. The light-emitting module according to claim 2, wherein the connection member includes a first connection portion and a second connection portion that are matched with each other; at least a portion of the first connection portion is fixed in the mounting groove; the second connection portion is fixedly connected to the backboard and the first connection portion.

5. The light-emitting module according to claim 4, wherein the first connection portion is a nut, and the second connection portion is a screw.

6. The light-emitting module according to claim 4, wherein the first connection portion includes a fixing portion and a positioning portion that are connected to each other; the fixing portion is fixedly disposed in the mounting groove, and the positioning portion is located in the via hole.

7. The light-emitting module according to claim 6, wherein a height of the fixing portion in an axial direction thereof is substantially equal to a depth of the mounting groove.

8. The light-emitting module according to claim 6, wherein the positioning portion is in clearance fit with the via hole.

9. The light-emitting module according to claim 6, wherein a height of the fixing portion in an axial direction thereof is less than a depth of the mounting groove.

10. The light-emitting module according to claim 4, wherein the first connection portion is riveted to the mounting groove.

11. The light-emitting module according to claim 6, wherein the fixing portion is riveted to the mounting groove.

12. The light-emitting module according to claim 1, further comprising:

an intermediate insulating layer disposed between the first light-emitting circuit layer and the carrier substrate.

13. The light-emitting module according to claim 12, wherein the intermediate insulating layer is made of a thermosetting resin.

14. The light-emitting module according to claim 1, wherein a number of the at least one connection member is at least two, and a distance between two adjacent connection members is in a range from 120 mm to 130 mm.

15. The light-emitting module according to claim 1, further comprising:

a second light-emitting circuit layer disposed on a side of the backboard away from the carrier substrate.

16. A display apparatus, comprising:

the light-emitting module according to claim 1.

17. A method of manufacturing a light-emitting module, comprising:

forming a first light-emitting circuit layer stacked on a carrier substrate;

providing a backboard on a side of the carrier substrate away from the first light-emitting circuit layer; wherein the backboard is in direct contact with the carrier substrate;

providing a mounting cavity in at least one of the backboard and the carrier substrate, wherein an inner wall of the mounting cavity is enclosed by both the backboard and the carrier substrate; and providing a connection member in the mounting cavity, so that the connection member is fixedly connected to the carrier substrate and the backboard.

18. The method of manufacturing the light-emitting module according to claim 17, wherein the mounting cavity includes a mounting groove disposed in the carrier substrate and a via hole penetrating the backboard; wherein an opening of the mounting groove is disposed in a surface of the carrier substrate proximate to the backboard; and the connection member includes a first connection portion and a second connection portion;

providing the connection member in the mounting cavity includes:

fixing at least a portion of the first connection portion in the mounting groove; and making the second connection portion pass through the via hole and be matched with the first connection portion.

19. The method of manufacturing the light-emitting module according to claim 18, wherein the mounting groove penetrates the carrier substrate;

before the first light-emitting circuit layer is formed on the carrier substrate, the method of manufacturing the light-emitting module further comprises:

inserting a hole plug into the mounting groove of the carrier substrate;

forming an intermediate insulating layer on the carrier substrate; and removing the hole plug in the mounting groove; wherein forming the first light-emitting circuit layer on the carrier substrate includes forming the first light-emitting circuit layer on a side of the intermediate insulating layer away from the carrier substrate.

20. The method of manufacturing the light-emitting module according to claim 19, wherein after the hole plug is inserted into the mounting groove, an anti-adhesion film is formed between the hole plug and the mounting groove.

* * * * *